Feb. 27, 1968 LE ROY A. PROHOFSKY 3,371,249

LAMINAR CIRCUIT ASSEMBLY

Original Filed March 19, 1962 2 Sheets-Sheet 1

INVENTOR.
LEROY A. PROHOFSKY

Feb. 27, 1968 LE ROY A. PROHOFSKY 3,371,249

LAMINAR CIRCUIT ASSEMBLY

Original Filed March 19, 1962 2 Sheets-Sheet 2

INVENTOR.
LEROY A. PROHOFSKY

United States Patent Office 3,371,249

Patented Feb. 27, 1968

3,371,249

LAMINAR CIRCUIT ASSEMBLY

Le Roy A. Prohofsky, Minneapolis, Minn., assignor to Sperry Rand Corporation, New York, N.Y., a corporation of Delaware Original application Mar. 19, 1962, Ser. No. 180,685, now Patent No. 3,187,426, dated June 8, 1965. Divided and this application Sept. 24, 1964, Ser. No. 398,969

7 Claims. (Cl. 317—101)

This invention relates generally to a multilayer circuit assembly and is a division of copending application Ser. No. 180,685 filed Mar. 19, 1962, and now Patent No. 3,187,426.

Printed circuits are well known in the art and are extensively used in the electronics industry. Recent trends in the industry toward miniaturization of electronic devices have resulted in a variety of printed circuit packaging schemes for arranging a compact circuit assembly. Because modern complex electronic equipment requires unitized construction permitting ease in assembly and maintenance, today's packaging concepts emphasize modular construction, and these concepts have been extended to include printed circuit assemblies. For example, in one scheme, the printed circuit card is reduced in size and several cards are assembled in stacked or superimposed relation. Accompanying this method of arranging printed circuit cards in stacked relationship is the problem of electrically interconnecting the cards. Efforts to minimize spacing between the stacked cards have been limited by the method used to interconnect the circuitry of the various stacked cards. Though circuit and component sizes may be reduced, the number of interconnections required remains the same. Consequently, a reduction in size of the circuit card results in an increased density of interconnecting points. Thus major factors limiting the degree of miniaturization which may be achieved by stacking printed circuit cards are the means and method used to electrically interconnect the cards.

Two interconnecting methods employed in the past were point-to-point wiring and the use of edge connecting devices. Point-to-point wiring is undesirable in that in a miniaturized assembly of stacked cards, reliable connections between the cards are extremely difficult and expensive to make and are subject to serious error. Edge connecting devices are undesirable in that they necessitate the disposition of the terminal portions of card circuitry along at least one of the card perimeters and also require the cards to be sufficiently spaced apart to appropriately accommodate the connecting means. Use of edge connecting devices also results in increased cost, increased weight of the assembly, and increased bulk as a result of the necessary connector harness. An inspection of the prior art reveals that efforts to minimize the distance between the printed circuit cards forming the stacked assembly have been frustrated by the limited methods presently available for interconnecting the cards.

The present invention provides a new multilayer printed circuit assembly, and a new method and means to make electrical connections between the assembly layers. The invention provides a soldering method for electrically and mechanically interconnecting the stacked printed circuit cards while permitting minimum spacing between the cards and between interconnecting points. The invention permits a reduction in the volume of a multilayer printed circuit assembly and allows increased density of interconnecting points.

This is accomplished in accord with the present invention by providing in each card a predetermined arrangement of plated-through holes, and disposing appropriate circuitry in the form of conductive strips on one face of the card, the conductive strips terminating at the plated-through holes. The cards are arranged in stacked relationship, the hole pattern of each card being aligned with the hole pattern of the other cards. The cards are maintained in such aligned stacked arrangement by means of a compression type jig or fixture. After the cards have been secured in a fixed relationship, a masking device is disposed about the perimeter of the stack. Subsequently an interconnecting means in the form of a wire wick is inserted in each aligned series of holes, the wick being frictionally retained within the holes and having its terminal portions extending outwardly from the bottom and top of the stack. The entire assembly is then immersed in a molten solder bath approximately to the top of the stack. The solder is prevented from flowing over the top card or inwardly between the cards of the stack at the perimeter thereof by the masking device. Solder, under the influence of capillary action and displacement forces, ascends each wick and the space between the wick and the metallic walls, and is thereby disposed upon the walls of the hole and the wick, and upon cooling, the solder forms a mechanical and electrical interconnection. By exposing a portion of the base or substrate material which is non-solder wettable, solder ascending the wick is prevented from flowing between the cards in a direction transverse to the wick. Solder, due to its high surface tension, constricts in the area of the exposed base material.

In a preferred embodiment of the product of the method of this invention, the multilayer circuit assembly is used in the modular construction of a logic circuit system. The wicks are fitted with female connectors which are received by a housing. Mating with the female connectors are the male pins of logic circuit modules. The logic circuitry is selectively interconnected by the wicks and card circuitry.

Accordingly, it is an object of the present invention to provide a method for electrically and mechanically interconnecting a multilayer printed circuit assembly whereby the distance between adjacent printed circuit cards may be minimized.

It is a further object of this invention to provide a method for electrically and mechanically interconnecting a plurality of closely spaced, superimposed printed circuit cards in a single, soldering operation.

It is also an object of this invention to provide a method and means for compactly arranging a plurality of printed circuits, such method and means also permitting increased density of electrical connecting points.

It is also an object of this invention to provide a printed circuit multilayer assembly wherein the circuit layers are firmly secured relative to one another without end or side supporting devices.

It is a still further object of this invention to provide a modularly constructed circuit assembly.

These and other more detailed and specific objectives will be disclosed in the course of the following specification, reference being made to the accompanying drawings, in which.

Figure 6:
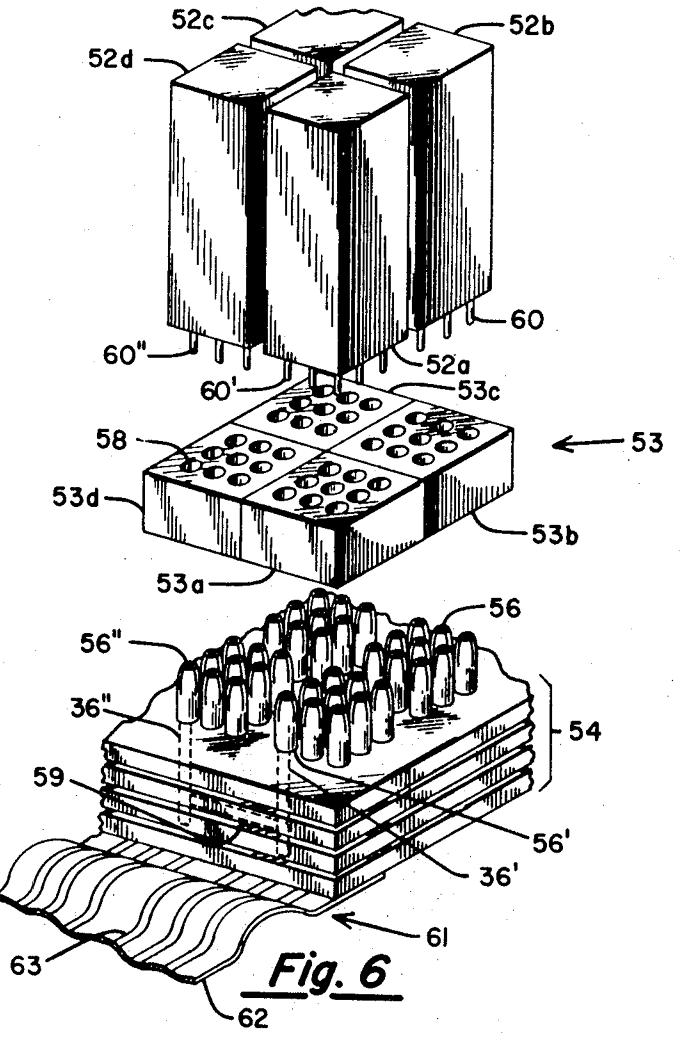
Figure 5A:
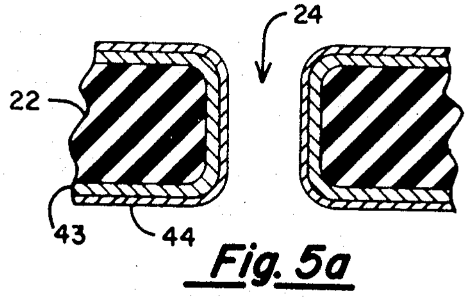
Figure 5B:
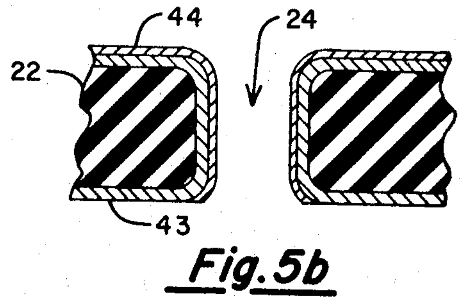
Figure 5C:
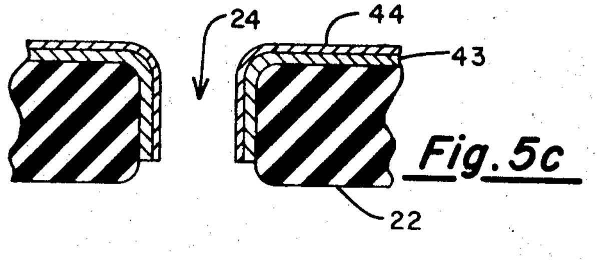

FIG. 5*a* illustrates in cross-sectional side view a small portion of a circuit card after the coating step of this method has been completed, the back portion of the aperture being removed for clarity in illustration;

FIG. 5*b* is a view of the FIG. 5 illustration after the coating on the bottom portion of the circuit card has been partially removed;

FIG. 5*c* is a view of the FIG. 5*b* illustration after removal of portions of the coating within the aperture on the printed circuit card;

FIG. 6 is a perspective view of a modularly constructed circuit assembly employing the printed circuit assembly formed in accordance with the method of this invention.

Figure 1:
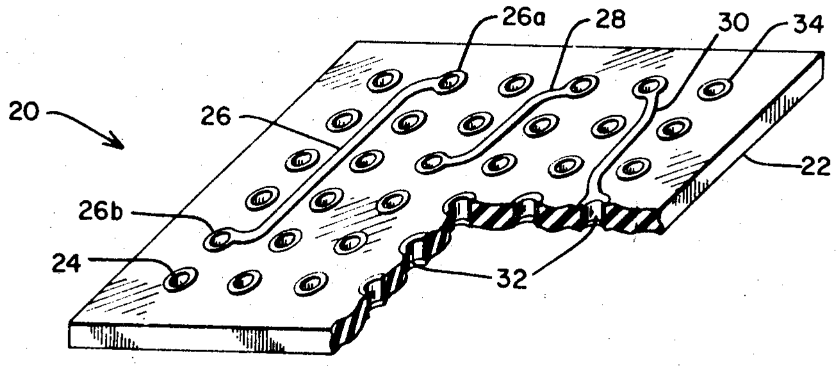
FIG. 1 is a perspective view of a multiapertured, single-layered printed circuit card of the type used in the present embodiment, a small portion of the card being shown in cross-section.

Referring now to FIG. 1, there is seen a multi-apertured circuit card 20 which includes an insulating base material 22 and a plurality of conductive strips 26, 28 and 30. The printed circuit base material 22 is preferably a ceramic material having a thickness of about 0.062 inch. However, other heat resistant material such as epoxy resins, may be used as a base material. Preferably the selected base material is solder repellent. The expression "solder repellent base material" is used herein to identify a material that will not readily lend itself to wetting by solder.

An acceptable ceramic is Fotoceram material, a product of Corning Glass Works, Inc. which is characterized for its high temperature resistance and etching qualities. In preparation, apertures, such as the apertures 24, are etched in the base ceramic in accordance with a predetermined arrangement. In the instant embodiment the aperture pattern is developed by etching the base ceramic material to form the apertures 24 at the intersections of lines forming a 0.10 inch grid. No limitation is intended by the mention of a 0.10 inch grid. Apertures having a diameter of about 0.016 inch have been formed on a 0.035 inch grid pattern. A grid pattern distribution of the apertures was chosen because in the light of the several parameters considered, such an arrangement permits the formation of a maximum number of apertures. The apertures 24 in the instant embodiment have an approximate diameter of 0.052 inch; however, any suitable combination of aperture diameter and wire diameter may be utilized. The desired configuration of printed wiring, such as conductive strips 26, 28 and 30 each having a thickness of the order of 0.005 inch, is formed on one side of the card 20 by etching. These strips terminate at the apertures 24 as exemplified at 26*a* and 26*b*. The fabrication of the electrically conductive portions of the circuit card may be accomplished in any one of several conventional ways and will hereinafter be explained in greater detail. Surrounding each aperture 24 is a small annular metallic ring 34 which is preferably formed of the same material as the conductive strips. The ring 34 is preferably integral with the metallic coating 32 deposited on the aperture walls.

Figure 2:
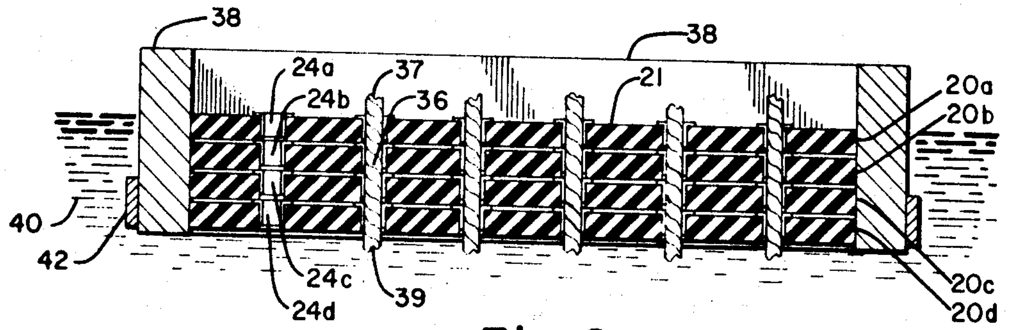
FIG. 2 is a cross-sectional side view of an exemplary stack of printed circuit boards arranged in accordance with the method of this invention, such stack being shown disposed in a molten solder bath.

Referring now to FIG. 2, there is seen a stacked plurality of circuit layers 20*a*, 20*b*, 20*c*, and 20*d*. Four circuit layers have been chosen for exemplifying the embodiment herein, although as many as sixteen 0.062 inch thick circuit layers have been soldered simultaneously by the method taught by this application. The circuit cards 20*a*, 20*b*, 20*c*, and 20*d* are substantially identical with circuit card 20 with the exception that the different layers will exhibit a different pattern of conductive strips. Usually a cover plate (not shown) having the same construction as the circuit cards except that it has no conductive strips, is placed on top of the uppermost circuit card, in this case card 20*a*, for protecting the top circuit card and its associated circuitry. Preferably circuitry is located only on one side of each card. However, by utilizing alternate cards as spacers only, circuitry could be disposed on either or both sides of the circuit cards.

The aperture pattern is normally the same for each layer, and the layers are superimposed with the apertures of each individual layer in registration with the apertures of the adjacent layer. Thus, an aligned series of apertures, for example, the series of apertures 24*a*, 24*b*, 24*c* and 24*d* is formed by appropriately locating the various layers formed in the stack. An interconnecting member or wicking means 36 is disposed through an aligned series of apertures such that its ends 37 and 39 project outwardly from the apertures. In the specifically identified aperture series a wick was not shown for clarity in illustration. Preferably the member 36 is in the form of a stranded wire having a diameter slightly less than the diameter of the apertures. To prevent the wire from slipping through a series of apertures, it may be bent or distorted slightly. Upon disposition of the wire in a series of apertures, the bent portion of the wire frictionally engages a portion of the plated coating 32 on the aperture walls with sufficient force to secure the wire in the desired position. The superimposed cards may be secured in stacked relationship by means of a C-clamp (not shown) or the like.

After the cards have been stacked and secured in adjacent relationship, a dam 38 is disposed about the periphery of the stack. The dam may consist of a silicon rubber compond or other heat resistant material and may be secured or held against the stack assembly by means of a clamping device 42 which extends about the periphery of the stack. The dam 38 is used as a masking device to prevent solder from the molten solder bath 40, in which the stack is immersed, from entering the stack through spaces between the layers, such spaces being present because of the location of the conductive strips on the surface of the cards. If desired, the strips may be recessed in the cards such that the card and strip surfaces are flush.

FIG. 2 also illustrates the attitude of the stacked cards with respect to the solder bath 40 after immersion of the stack in the bath. Thus it is seen that the uppermost surface 21 of the card 20*a* is at substantially the same level or slightly below the level of the bath. The reason for immersing the stack to such a level in the solder bath will be discussed more fully hereinafter.

Figure 3:
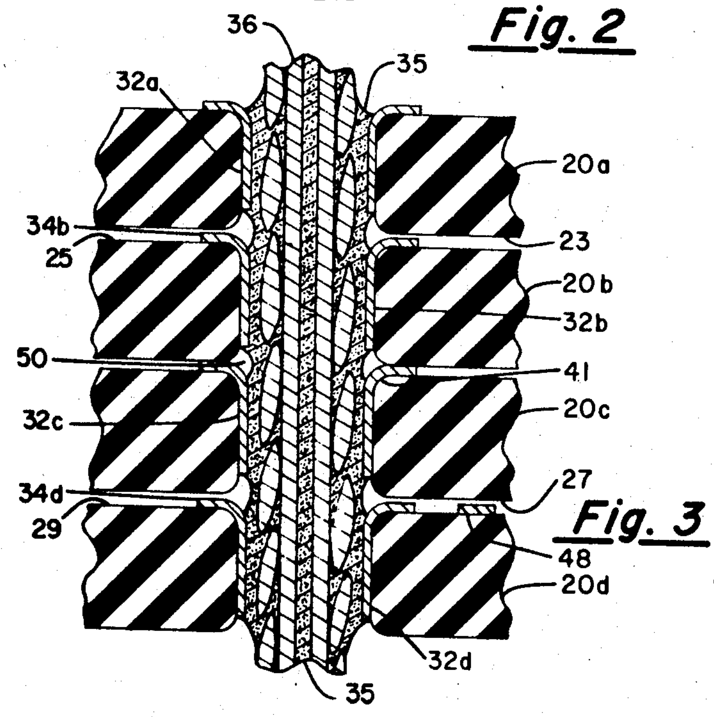
FIG. 3 is an enlarged cross-sectional side view of a portion of a stack of printed circuit cards, such portion including a single aligned series of apertures having an interconnecting means soldered to the coating on the aperture walls.

Referring now to FIG. 3 there can be seen a continuous solder joint 35 connecting the wicking means 36 with the solderable coatings 32*a*, 32*b*, 32*c*, 32*d* of each apertured wall of the individual circuit layers. As is seen, the solder has not only filled any space between the wires forming the wick, but has also substantially filled the annular-like space present between the wick and the material covering the aperture walls. This particular view has been substantially enlarged to more clearly illustrate the many practical considerations involved in the described method for selectively interconnecting layers of stacked printed circuit cards. It should be noted that as a practical matter the majority of the aperture 24 edges are somewhat rounded rather than square, for example as at 41. It should also be appreciated that the planar surfaces of each circuit card are not perfectly flat nor is the conductive coating deposited uniformly thereon, and that for these reasons the annular spacer or barrier ring 34 surrounding any given aperture may not be in physical contact with the underside of the circuit layer immediately above it. An exaggerated view of such a condition is illustrated at the interfacial spaces formed by circuit layers 20*a* and 20*b* and circuit layers 20*c* and 20*d*. It is seen that annular rings 34*b* and 34*d* are separated respectively some small distance from the bottom surfaces 23 and 27 respectively of circuit layers 20*a* and 20*c* respectively. Liquid solder present at the upper level of the annular ring 34*b* or ring 34*d* is prevented from flowing outwardly along the surfaces 25 and 29 of circuit layers 20*b* and 20*d* respectively by the method of this invention as will be seen hereinafter. In an ideal situation, such as is suggested by FIG. 2, all of the annular rings would tightly abut the bottom surface of the next adjacent circuit layer and thereby provide in effect a closed wall container for restricting the solder as it ascends the wicking means 36. As a practical matter, however, this does not occur. The various circuit layers comprising the stack are not perfectly planar and spaces exist between the layers which would allow solder ascending the interconnecting means 36 and the annular space between the means and the aperture walls to flow outwardly in a direction transverse to the wick and cover the face of the circuit layer. Uncontrolled transverse solder flow could cause a short circuit between conductive strips present on the particular layer. For example, if solder escaped uncontrollably through the space between circuit layers 20*c* and 20*d*, it could electrically connect conductive strip 48 with the aperture wall coating 32*d*. Additionally, escaping solder could electrically connect two wicks. In the present invention transverse solder flow is controlled by effecting a solder constriction in the area of the spaces between adjacent circuit layers. It should be noted at this time that the aperture wall is not fully covered with the solderable coating 32 throughout its entire length. At the lowermost portion of each aperture, the insulating base material, which is not solder wettable, is exposed. Thus, as ascending solder approaches the space between two circuit layers, any tendency it may have to flow along the surface of one layer in a direction transverse to the wick is overcome because of its inability to wet the exposed base material surface of the next adjacent circuit layer. Thus it is seen that the selective exposing of the base material causes the solder to constrict or withdraw toward the wick forming a void 50. It is this particular feature of the invention that emphasizes one of its extremely practical aspects. The inability to purchase or economically produce perfectly flat layers of insulating material having a coating of uniformly electrodeposited metal such that when one circuit layer is superimposed upon the other, their surfaces mate so perfectly that no space exists therebetween, would, in the absence of this invention, substantially preclude the use of solder immersion techniques for internally joining a stack of printed circuit cards.

Figure 4:
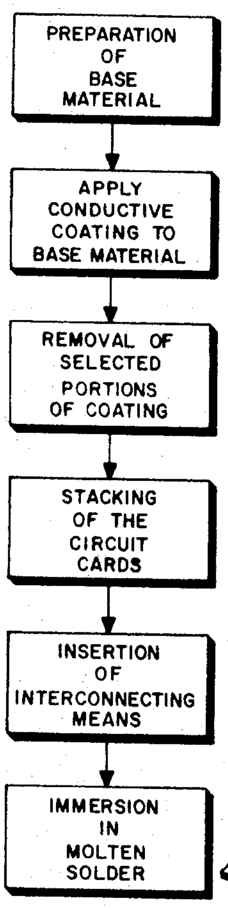
FIG. 4 is a flow chart illustrating a preferred process for electrically and mechanically interconnecting a printed circuit multilayer assembly.

As is indicated in the flow chart of FIG. 4, the method disclosed herein commences with step 1 wherein the apertures 24 are formed in the insulating base material 22. When using certain types of ceramic base material, the apertures may be formed by etching. Preparing such material for etching may involve a photo process whereby the areas or portions of the base material desired to be etched away are exposed to a light source through a negative or other suitable light masking device. The light is effective to change the material such that it is susceptible to an acid etchant. Alternatively, of course, the apertures may be formed by drilling or punching, as might be the case where a particular base material does not lend itself to etching. The printed circuit may also be formed by molding, the apertures being formed during the molding process. For example, an epoxy resin could be cast on a mold which is provided with a number of arranged pegs for causing the apertures to form in the epoxy. The pegs may be coated with a non-adherent covering of copper having a predetermined thickness. Then upon removal of the mold, the copper adheres to the hardened epoxy and forms the coating on the aperture walls. In a photo process as used in preparing certain types of material for etching, it should be noted that the scattering of light rays precludes the etching of perfectly straight walls. This is one of the reasons that the apertures 24 have rounded edges 41 as was illustrated in FIG. 3.

Next step 2 is performed. Subsequent to the base material for etching, it should be noted that the scattering including the aperture walls, is coated with a layer of an electrically conductive material, such as copper. The coating process may be readily performed in accordance with well known electroplating techniques for plating on electrically nonconductive base materials. For example, a chemically deposited layer of copper may be caused to deposit on the surfaces of the circuit layer, this chemically deposited layer later having its thickness increased by electrodepositing copper thereon. In the instant embodiment, a thin layer of electrodeposited gold is also selectively deposited over the copper, such gold later serving as a resist during the etching operation. Of course, other suitable etchant resists may be used in lieu of gold. The gold electrodeposited on one side of the card is only permitted to deposit in those areas where the copper is to remain. This is accomplished through the use of plating resists in the manner well known in the art.

After the coating step has been completed, step 3 is performed. One side of the coated card is abraded for causing the gold etchant resist to be removed therefrom. This usually results in the removal of some copper also. The plating resist which was used to cover certain portions of the copper to prevent gold from depositing thereon is also removed at this time. The card is next immersed in a ferric chloride etching solution where all exposed copper is removed. The gold-masked areas assume the shapes of the conductive strips, the annular rings about the apertures, and the coating on the aperture walls. In most etching operations of this nature, under-cutting by the etchant is undesirable in that it removes copper that should be permitted to remain. However, in this invention the undercutting is operator-controlled, and exploited to an advantage and developed as a desirable feature. Referring now to FIG. 5*a* there is seen an exploded portion of the coating as it appears on the aperture walls and upper and lower card planar surfaces immediately after the completion of the coating step. There can be seen an insulation layer 22, a layer of copper 43, and a layer of gold 44 superimposed on the layer of copper.

FIG. 5*b* illustrates the card immediately subsequent to the abrasion of the underside of the card. There it is seen that the layer of gold 44 has been removed on the undersurface of the card along with a small portion of the copper layer 43. It will be appreciated by those skilled in the art that when the underside of this card is exposed to a ferric chloride etchant, the etchant will immediately attack the copper layer 43. In the area of the aperture 24, this will result in the removal of copper to which the gold layer 44 is attached and the gold attached to such copper will fall away exposing the base material within the aperture. The use of a thin film of gold as a resist in the method taught herein for practicing this invention is not to be construed as a limitation. One skilled in the art will appreciate that many other organic and inorganic resist materials may be employed and that such resists may be applied in diverse ways.

Referring now to FIG. 5*c* it can be seen that the copper and gold have been removed from the underside of the layer 22, and a portion of the insulation layer which forms the wall of the aperture has been exposed. As will be seen hereinafter, exposure of the base material within the aperture 24 by etchant undercutting is advantageously utilized.

Step 4 is performed after the cards have been rinsed and allowed to dry and is initiated by assembling the cards in a stack. The cards are stacked such that the apertures of any one card are registered with the apertures of the next adjacent card. After the cards have been properly registered, they are secured in place by a guide pin or clamping means. Additionally, at this time a masking device or dam 38 is disposed about the entire periphery of the stack. The dam may be constructed of any heat resistance material that will lend itself to enclosing tightly at least the bottom portion of the stack for preventing solder from entering the space between the various layers forming the stack during the time that the stack of circuit cards is immersed in a solder bath.

After the masking device is fixed relative to the stack of circuit cards, step 5 is initiated. During this step a wicking means 36 is inserted from one side of the stack through each series of aligned apertures. The length of the wick is preferably such that its ends 37 and 39 extend outwardly from the stack of circuit cards. The number of wicks 36 that are inserted into a stack is generally equal to the number of apertures 24 appearing in any single circuit card. Preferably the wicking means takes the form of stranded, fine copper wire which has been found to produce the best capillary action. However, small diametered tubing has been successfully employed as a wicking means. For example, a copper plated, stainless steel tube having an outside diameter of 0.015 inch has been utilized as a wicking means in apertures having a diameter of 0.016 inch. Solder readily ascends the space available between the coating on the aperture walls and the external tube surface.

After all the wicks 36 have been properly inserted, step 6 is commenced. The stack of circuit cards, for example, cards *22a*, *22b*, *22c* and *22d* along with the wicking means 36 are immersed in a molten solder bath to a depth where the level of the molten solder 40 is substantially at the level of the uppermost surface 21 of the top circuit card of the stack. While the stack is immersed in the solder bath, the solder ascends the wicks 36 and any space between the wicks and the coating on the aperture walls by a combination of capillary action and displacement forces. The solder immersion step is continued until it is visually determined that solder is present in each wick at the uppermost level of the printed circuit stack. When the operator determines that the soldering operation is complete, the stack is removed from the bath and permitted to cool at room temperature. After formation of the solder joint 35 between the plated aperture walls and the wick, that portion 39 of the wick which had previously been in direct contact with the solder is normally cut off and polished down such that the wick and the lowermost surface of the bottom circuit layer of the stack are flush.

Referring now to FIG. 6, which illustrates a packaging scheme utilizing a stack of printed circuit cards joined in accordance with this invention, there is seen a plurality of logic circuit modules *52a*, *52b*, *52c* and *52d* and an electrically insulating housing 53. The housing is divided into quadrants *53a*, *53b*, *53c* and *53d* with each quadrant having nine holes 58 therethorough. Each hole receives one of the connector pins 60 which extend from the logic circuit modules in a predetermined pattern for cooperating with the housing hole pattern. The pins are appropriately connected to electrical circuits (not shown) within their respective logic circuit modules.

A female connector 56 is affixed, for example by soldering or crimping, to each outwardly extending end portion 37 of the wicks 36. The connectors 56 are also received by the holes 58 in the housing 53 and mate with the pins 60 in electrical engaging relationship. Two wicks 36′ and 36″ shown in phantom are electrically connected to a conductive strip 59, also shown in phantom, by the method of this invention. The wicks 36′ and 36″ are affixed respectively to connectors 56′ and 56″. When the logic circuit block *52a* is plugged into a multilayer assembly 54 pin 60′ is electrically received by connector 56′, and when logic circuit block *52d* is plugged in, pin 60″ makes electrical contact with connector 56″. Thus it can be seen that logic circuit blocks can be electrically connected in a predetermined manner. For providing power and voltage signals to the logic circuit blocks, a flexible cable 61 consisting of a thin isulating base 62 and a plurality of conductors 63 disposed thereon may be used. The conductors may be connected to selected wicks, for example, by soldering.

It is understood that suitable modifications may be made in the structure as disclosed provided such modifications come within the spirit and scope of the appended claims. Having now, therefore, fully illustrated and described my invention, what I claim to be new and desire to protect by Letters Patent is:

What is claimed is:

1. A multilayer circuit assembly comprising: a stacked plurality of circuit layers, each layer having an electrically insulating, solder repellent base, and each of the layers having a plurality of apertures coordinately arranged therein, the apertures of one of the layers being aligned with the apertures of any other of the layers; a plurality of conductive strips disposed on only one face of the base, the strips terminating at predetermined apertures; a solderable coating covering a portion of the wall of each aperture, that end of the aperture wall opening on the nonconductor bearing face of the base being devoid of coating, the coating on the walls of the predetermined apertures being electrically connected to the strips terminating at the apertures; and an interconnecting wick member disposed through each aligned series of the apertures for causing capillary attraction of applied solder to form a continuous solder joint electrically connecting the member and the solderable coating on each wall of the series.

2. A multilayer printed circuit assembly comprising: a plurality of superimposed electrically insulating supports, each of said supports having first and second surfaces and each of the supports having a plurality of coordinately arranged apertures therethrough, the apertures of one of the supports being aligned with the apertures of any other of the supports; a solderable coating covering a portion of the wall of each aperture, that end of the aperture wall opening on the second surface of the supports being devoid of coating, at least one conductive strip disposed on said first surface of each support, each end of said strip being connected to said solderable coating at a predetermined aperture on said first surface for forming an electrical connection between said aperture coatings, an annular ring of solderable material on a surface of the support and surrounding each aperture, the solderable coating and the solderable material being integral; and an interconnecting wick member disposed through an aligned series of said apertures and extending from the bottom on the superimposed supports to the top thereof; said wick member causing capillary attraction of applied solder to form a single solder joint coupling the solderable coating on each aperture wall of the series with the interconnecting member.

3. A multilayer circuit assembly comprising: a plurality of superimposed electrically insulating supports each having first and second planar surfaces, and each of said supports having a plurality of apertures therein, the apertures of one of said supports being aligned with the apertures of any other of the supports; a solderable coating covering a portion of the wall of each aperture, that end of the aperture wall opening on the second planar surface being devoid of coating, conductive material disposed on only a first planar surface of each support and electrically connecting said coating at predetermined apertures, an interconnecting wick member disposed through an aligned series of the apertures for causing capillary attraction of applied solder and extending from the bottom of the arranged superimposed supports to the top thereof; stop means between each of the supports for preventing the transverse flow of solder; and a continuous solder joint coupling the solderable coating and the member.

4. A device as in claim 3 wherein the stop means includes an annular ring on the first planar surface surrounding each aperture, the ring being disposed adjacent the second planar surface of the next adjacent support in the circuit assembly.

5. A device as in claim 4 wherein the annular ring and the solderable coating are integral.

6. A modularly arranged circuit system comprising: a multilayer circuit assembly including a plurality of solder repellent insulating supports having first and second planar surfaces and having disposed therethrough in accordance with a predetermined arrangement a plurality of apertures, the apertures of the supports being registered to form a first and second series of aligned apertures, the wall of each aperture being partially covered with a solderable coating such that the end of the aperture wall opening on the second planar surface of each support is devoid of coating and at least one of the supports having disposed on only the first planar surface thereof a conductive strip, the strip terminating at two of the apertures, one of such apertures being in the first series of apertures and the other being in the second series and being electrically connected to the solderable coating covering the two aperture walls; first and second interconnecting members, one being disposed in the first aligned series of apertures, the other being disposed in the second aligned series, each of the members having portions thereof extending outwardly from the stack; a first continuous solder joint connecting the first interconnecting member to the solderable coating on each aperture wall of the apertures forming the first aligned series of apertures; a second continuous solder joint connecting the second interconnecting member to the solderable coating on each aperture wall of the apertures forming the second aligned series of apertures, the two interconnecting members being electrically connected to the conductive strip by their respective solder joints; first and second connector elements respectively electrically connected to the first and second outwardly extending portions of the interconnecting members; a circuit module having electrical circuits therein; first and second terminal pins electrically connected in a predetermined manner to the electrical circuits, the first and second terminal pins being releasably electrically connected respectively to the first and second connector elements for completing an electrical circuit including the conductive strip on the insulating support.

7. A multilayer circuit assembly comprising: A stacked plurality of layers of multiapertured electrically insulating supports having first and second planar surfaces, the apertures being arranged in accord with a predetermined pattern and the apertures of one of the supports being aligned with the apertures of any other of the supports; at least one conductive strip disposed only on the first surface of each of the supports and terminating at predetermined apertures; a solderable coating covering a portion of the wall of each aperture, that end of the aperture wall opening on the second surface of each support being devoid of coating, said strip and said coating being integrally formed, an interconnecting wick member disposed through each aligned series of the apertures for causing capillary attraction of applied solder to form a solder joint coupling the solderable coating on each aperture wall of the series and the interconnecting member disposed through the series by causing the strip to be electrically connected to the member, an insulating housing having a plurality of holes therethrough; a plurality of first electrical connecting members, each of the first members being affixed to one of the interconnecting members and being supported in one of the holes in the insulating housing; a circuit block having a plurality of electrical circuits; and a plurality of second electrical members electrically connected to the circuits within the block and connected within the housing to predetermined ones of the first members.

References Cited

UNITED STATES PATENTS

| | | | |
|---|---|---|---|
| 2,734,150 | 2/1956 | Beck | 174—68 |
| 2,907,925 | 10/1959 | Parsons | 174—68 |
| 2,912,745 | 11/1959 | Steigerwalt et al. | 174—68 |
| 2,700,150 | 1/1955 | Wales | 317—101 |

DARRELL L. CLAY, *Primary Examiner.*

LEWIS H. MYERS, *Examiner.*